United States Patent
Cai et al.

(10) Patent No.: US 9,270,270 B2
(45) Date of Patent: Feb. 23, 2016

(54) CLOCK GATING CIRCUIT FOR REDUCING DYNAMIC POWER

(71) Applicant: QUALCOMM INCORPORATED, San Diego, CA (US)

(72) Inventors: Yanfei Cai, Shanghai (CN); Ji Li, Shanghai (CN); Qiang Dai, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/420,230

(22) PCT Filed: Sep. 19, 2012

(86) PCT No.: PCT/CN2012/081576
§ 371 (c)(1),
(2) Date: Feb. 6, 2015

(87) PCT Pub. No.: WO2014/043856
PCT Pub. Date: Mar. 27, 2014

(65) Prior Publication Data
US 2015/0200669 A1    Jul. 16, 2015

(51) Int. Cl.
*H03K 3/00* (2006.01)
*H03K 19/00* (2006.01)
*H03K 3/356* (2006.01)

(52) U.S. Cl.
CPC ...... *H03K 19/0016* (2013.01); *H03K 3/356052* (2013.01)

(58) Field of Classification Search
None
See application file for complete search history.

(56) References Cited

U.S. PATENT DOCUMENTS

| 7,587,686 | B1 | 9/2009 | Schleicher, II |
| 7,750,680 | B2 * | 7/2010 | Mamidipaka ...... H03K 19/0016 326/93 |
| 7,772,906 | B2 | 8/2010 | Naffziger |
| 7,902,878 | B2 | 3/2011 | Saint-Laurent et al. |

(Continued)

FOREIGN PATENT DOCUMENTS

| CN | 101686041 A | 3/2010 |
| WO | WO-2010059359 A1 | 5/2010 |

OTHER PUBLICATIONS

International Search Report and Written Opinion—PCT/CN2012/081576—ISA/EPO—Jun. 27, 2013.

*Primary Examiner* — Long Nguyen
(74) *Attorney, Agent, or Firm* — Mahamedi Paradice LLP

(57) ABSTRACT

A clock-gating circuit is disclosed that may reduce unnecessary power consumption associated with clock distribution networks. For some embodiments, the clock-gating circuit includes a latch control circuit, a storage latch, and a logic gate. The control circuit has inputs to receive an input clock signal, a clock enable signal, and a clock gating control signal, and has an output terminal to generate a latch enable signal. The latch has a data terminal responsive to the clock enable signal, a latch enable terminal responsive to the latch enable signal, and an output to generate the clock gating control signal. The logic gate has inputs to receive the input clock signal and the clock gating control signal, and has an output terminal to generate an output clock signal. The clock-gating circuit may reduce power consumption during an enabled state by maintaining the latch enable signal at a constant logic state, thereby reducing dynamic power consumption by preventing internal logic gates from dynamically switching logic states while the input clock signal is gated.

17 Claims, 5 Drawing Sheets

(56) References Cited

U.S. PATENT DOCUMENTS

| | | |
|---|---|---|
| 8,030,982 B2 | 10/2011 | Datta et al. |
| 2005/0047222 A1 | 3/2005 | Rentschler |
| 2010/0174933 A1 | 7/2010 | Lu et al. |
| 2013/0194016 A1* | 8/2013 | Wimer ............... H03K 19/0016 327/199 |

* cited by examiner

US 9,270,270 B2

CLOCK GATING CIRCUIT FOR REDUCING DYNAMIC POWER

TECHNICAL FIELD

The present embodiments relate generally to electronic circuits, and specifically to clock gating circuits.

BACKGROUND OF RELATED ART

Dynamic power consumption is an ongoing concern for integrated circuit (IC) devices, especially with the ever-increasing clock frequencies used in synchronous IC devices. Indeed, for some IC devices, more than half of the total dynamic power consumption may be attributed to clock distribution networks. One technique to reduce the dynamic power consumption of clock distribution networks is to employ clock-gating circuits (CGC) that selectively gate a number of clock signals on the IC device. More specifically, clock-gating circuits may reduce power consumption by selectively pruning an IC device's clock tree, thereby disabling portions of the clock tree so that circuit elements such as latches and/or flip-flops associated with the disabled portions do not switch between logic high and low states. Thus, preventing such latches and/or flip-flops from toggling between logic states may significantly reduce dynamic power consumption of the IC device.

Unfortunately, many conventional clock-gating circuits consume an undesirable amount of dynamic power, even when disabled. For example, FIG. 1A shows a conventional clock-gating circuit 10 having two series-connected inverters INV1-INV2 that generate complementary clock signals $\overline{clk\_net}$ and clk_net in response to an input clock signal clk_in. The complementary clock signals $\overline{clk\_net}$ and clk_net control a pass gate 12, which provides a gating signal pn1 that is logically combined with clk_in in NAND gate 14 to generate an output signal pn2. Signal pn2 is inverted by inverter INV3 to generate the output clock signal clk. Although effective in selectively gating the input clock signal clk_in in response to a clock enable signal (clk_en), clock-gating circuit 10 undesirably consumes dynamic power because the output terminals of the series-connected inverters INV1 and INV2 undesirably toggle between logic states in response to transitions in the input clock signal clk_in.

Thus, there is a need to reduce the dynamic power consumption associated with distributed clock systems provided within IC devices.

BRIEF DESCRIPTION OF THE DRAWINGS

The present embodiments are illustrated by way of example and are not intended to be limited by the figures of the accompanying drawings, where.

Like reference numerals refer to corresponding parts throughout the figures.

DETAILED DESCRIPTION

A clock-gating circuit is disclosed that may reduce unnecessary power consumption associated with clock distribution networks. For some embodiments, a partially gated clock-gating circuit is disclosed that may significantly reduce dynamic power consumption by eliminating series-connected internal logic gates that toggle between logic states in response to logic transitions of an input clock signal. More specifically, rather than controlling the operation of a clock latch's pass gate with complemented versions of the input clock signal, partially gated clock-gating circuits of the present embodiments may control the pass gate with a latch enable signal that is generated in response to the input clock signal, a latch enable signal, and a clock gating feedback signal. In this manner, undesirable toggling of nodes internal to the partially gated clock-gating circuit is avoided.

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Figure 1A:
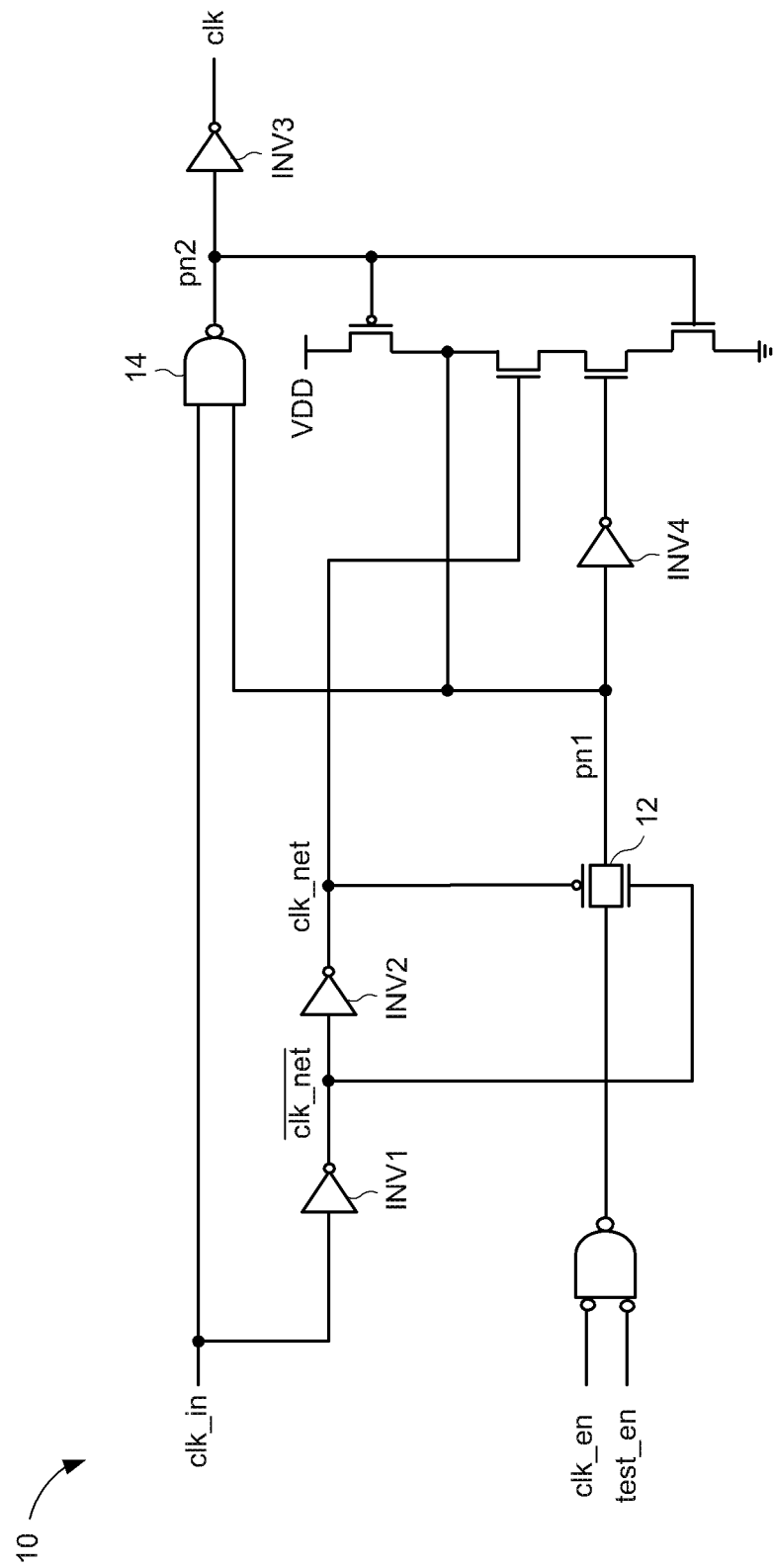
FIG. 1A is a block diagram of a conventional clock-gating circuit.
Figure 1B:
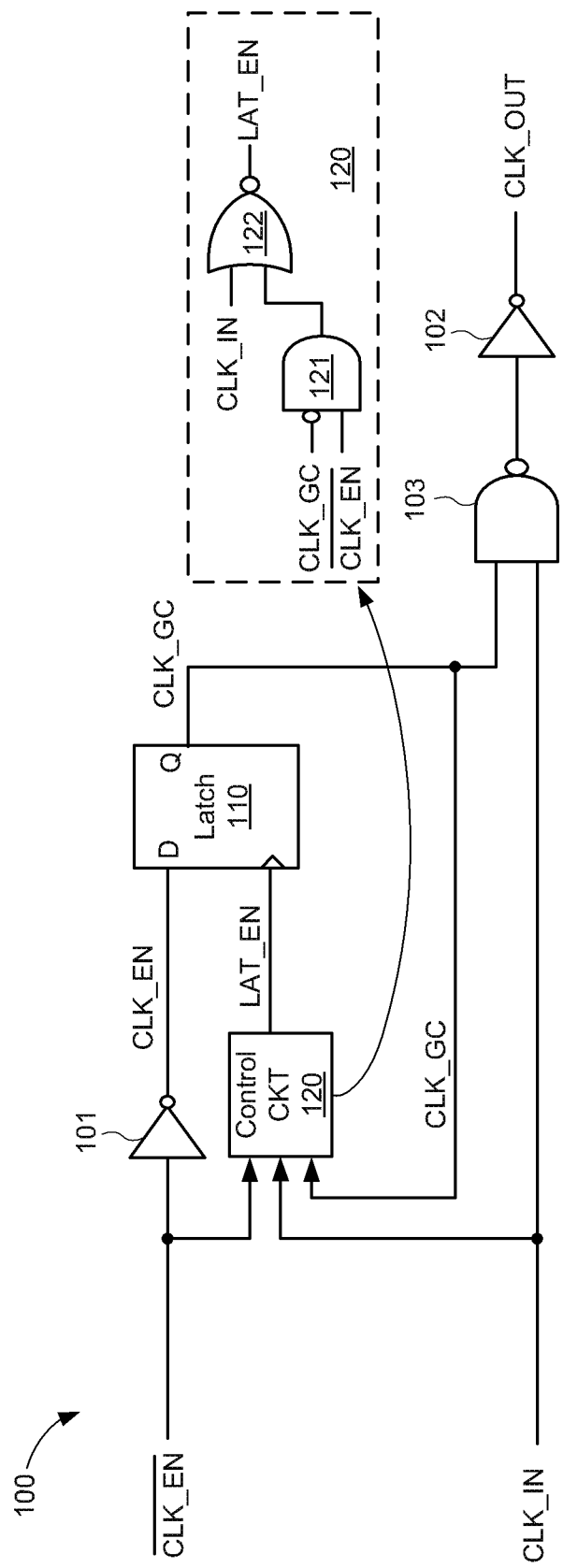
FIG. 1B is a block diagram of a partially gated clock-gating circuit in accordance with some embodiments.

FIG. 1B shows a block diagram of a partially gated (PG) clock-gating circuit 100 in accordance with some embodiments. The PG clock-gating circuit 100 selectively passes an input clock signal (CLK_IN) as an output clock signal (CLK_OUT) in response to an active-low clock enable signal ($\overline{CLK\_EN}$). More specifically, when $\overline{CLK\_EN}$ is de-asserted to logic high, PG clock-gating circuit 100 is enabled and forces CLK_OUT to remain in a constant logic state (e.g., logic low), thereby effectively gating CLK_IN and reducing power consumption by not propagating CLK_IN as CLK_OUT to other circuit elements (not shown for simplicity) coupled to PG clock-gating circuit 100. Conversely, when $\overline{CLK\_EN}$ is asserted to logic low, PG clock-gating circuit 100 is disabled and passes CLK_IN as CLK_OUT, thereby allowing the clock signal to propagate to such other circuit elements.

As shown in FIG. 1B, PG clock-gating circuit 100 includes two inverters 101-102, a NAND gate 103, a storage latch 110, and a latch control circuit 120. Inverter 101 includes an input terminal to receive $\overline{CLK\_EN}$, and includes an output terminal to generate an active-high clock enable signal (CLK_EN). The latch control circuit 120 includes an output terminal to generate a latch enable signal (LAT_EN), and includes input terminals to receive CLK_IN, $\overline{\text{CLK\_EN}}$, and a clock gating control signal (CLK_GC) provided as a feedback signal. The storage latch 110 includes a data terminal (D) to receive CLK_EN, a latch enable input (<) to receive LAT_EN, and an output terminal to generate CLK_GC.

NAND gate 103 includes input terminals to receive CLK_IN and CLK_GC, and includes an output terminal coupled to inverter 102, which includes an output terminal to generate CLK_OUT. Thus, when the clock gating control signal CLK_GC is in a logic low state, NAND gate 103 forces its output terminal to a logic high state, which in turn causes inverter 102 to maintain CLK_OUT in a logic low state. In this mode, PG clock-gating circuit 100 is enabled and gates the input clock signal CLK_IN. Conversely, when the clock gating control signal CLK_GC is in a logic high state, NAND gate 103 passes a logical complement of CLK_IN to inverter 102, which in turn generates CLK_OUT as a delayed version of CLK_IN. In this mode, PG clock-gating circuit 100 is disabled and passes CLK_IN as CLK_OUT. For some embodiments, NAND gate 103 and inverter 102 are a functional implementation of a logic AND gate.

Latch control circuit 120 generates LAT_EN in response to a logical combination of $\overline{\text{CLK\_EN}}$, CLK_IN, and CLK_GC. For the exemplary embodiment shown in FIG. 1B, latch control circuit 120 is implemented as an AND-OR-Invert (AOI) gate formed by AND gate 121 and NOR gate 122. More specifically, AND gate 121 includes inputs to receive $\overline{\text{CLK\_EN}}$ and a complement of CLK_GC, and includes an output coupled to a first input of NOR gate 122. NOR gate 122 includes a second input to receive CLK_IN, and includes an output to generate LAT_EN.

To enable PG clock-gating circuit 100 (e.g., to maintain CLK_OUT in a constant logic state), the clock enable signal $\overline{\text{CLK\_EN}}$ is de-asserted to logic high, which causes inverter 101 to de-assert CLK_EN to logic low. The logic high state of $\overline{\text{CLK\_EN}}$ causes latch control circuit 120 to maintain LAT_EN in a logic low state. More specifically, if the previous state of clock gating control signal CLK_GC is logic low (e.g., indicating that the clock-gating circuit 100 was previously enabled to maintain CLK_OUT in a constant logic state), then the logic high state of $\overline{\text{CLK\_EN}}$ maintains LAT_EN in the logic low state. Conversely, if the previous state of CLK_GC is logic high (e.g., indicating that the clock-gating circuit 100 was previously disabled to allow CLK_IN to propagate through circuit 100 as CLK_OUT), then LAT_EN is driven to logic high by the previous high state of CLK_GC after CLK_IN transitions to logic low. Thereafter, CLK_GC is driven to logic low in response to latch 110 latching the logic low state of CLK_EN. The resulting logic low state of CLK_GC is fed back to control circuit 120, which in response thereto drives LAT_EN to logic low.

The logic low state of LAT_EN causes latch 110 to continually keep the clock gating control signal CLK_GC in a logic low state. The logic low state of CLK_GC forces the output of NAND gate 103 to a logic high state, which causes inverter 102 to maintain CLK_OUT in a logic low state, irrespective of logic transitions in CLK_IN. In this manner, CLK_OUT is maintained in a constant logic low state, thereby reducing dynamic power consumption by not providing the clock signal to other circuit elements (not shown for simplicity).

Note that maintaining LAT_EN in a logic low state prevents the clock enable input (<) of latch 110 from toggling between logic states, and reduces power consumption associated with internal nodes of circuit 100 switching between logic high and low states.

Conversely, to disable PG clock-gating circuit 100 (e.g., to allow CLK_IN to propagate through circuit 100 as CLK_OUT), the clock enable signal $\overline{\text{CLK\_EN}}$ is asserted to logic low, which causes inverter 101 to assert CLK_EN to logic high. The logic high state of CLK_EN is provided to the D input of latch 110. The logic low state of $\overline{\text{CLK\_EN}}$ causes latch control circuit 120 to generate LAT_EN as the logical complement of CLK_IN, which in turn causes latch 110 to periodically latch the logic high state of CLK_EN at its D input. In this manner, latch 110 maintains the clock gating control signal CLK_GC in a logic high state. In response to the logic high state of CLK_GC, NAND gate 103 passes a logically complemented value of CLK_IN to inverter 102, which in turn produces a waveform for CLK_OUT that is similar to CLK_IN (e.g., except for delays associated with inverter 102 and NAND gate 103).

Figure 2:
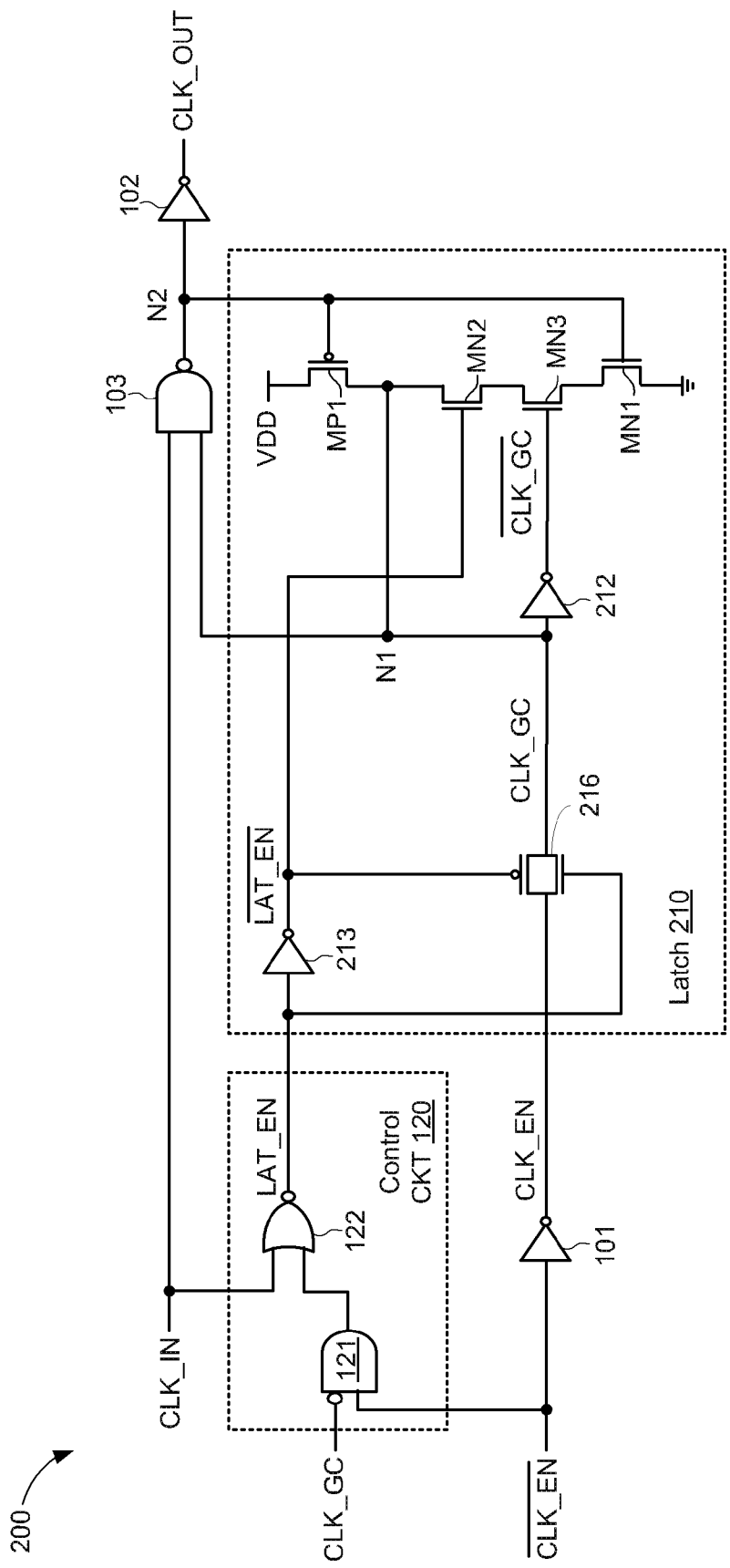
FIG. 2 is a schematic diagram of the partially gated clock-gating circuit of FIG. 1B in accordance with some embodiments.

FIG. 2 shows a PG clock-gating circuit 200 that is one embodiment of PG clock-gating circuit 100 of FIG. 1B. PG clock-gating circuit 200 is shown to include inverters 101-102, NAND gate 103, and latch control circuit 120 of FIG. 1B, as well as inverters 212-213, pass-gate 216, PMOS transistor MP1, and NMOS transistors MN1-MN3. Transistors MP1 and MN1-MN3, inverters 212-213, and pass gate 216 form a latch 210 that is one embodiment of latch 110 of FIG. 1. Transistors MP1 and MN1-MN3 are coupled in series between a supply voltage VDD and ground potential. The gates of transistors MP1 and MN1 are coupled to the output terminal of NAND gate 103 at node N2, which is coupled to the input of inverter 102. The gate of transistor MN2 receives a complemented latch enable signal $\overline{\text{LAT\_EN}}$ provided by inverter 213, and the gate of transistor MN3 receives a complemented clock gating control signal $\overline{\text{CLK\_GC}}$ provided by inverter 212.

The input clock signal CLK_IN is provided to first inputs of NAND gate 103 and control circuit 120. The clock enable signal $\overline{\text{CLK\_EN}}$ is provided to a second input of control circuit 120, and to an input of inverter 101. The clock gating control signal CLK_GC is provided as a feedback signal to an inverting input of control circuit 120. The output terminal of control circuit 120 generates LAT_EN, which is provided to a non-inverting control terminal of pass gate 216. Inverter 213 logically complements LAT_EN to generate $\overline{\text{LAT\_EN}}$, which is provided to an inverting control terminal of pass gate 216 and to the gate of transistor MN2. Inverter 101 logically complements $\overline{\text{CLK\_EN}}$ to generate CLK_EN, which is provided to an input terminal of pass gate 216. The output terminal of pass gate 216, denoted herein as node N1, provides the clock gating control signal CLK_GC to NAND gate 103 and to inverter 212. In response thereto, NAND gate 103 logically combines CLK_GC and CLK_IN to generate a signal at node N2, and inverter 212 provides the complemented clock gating control signal $\overline{\text{CLK\_GC}}$ to the gate of transistor MN3.

To enable PG clock-gating circuit 200, $\overline{\text{CLK\_EN}}$ is de-asserted to logic high, which causes inverter 101 to drive CLK_EN to logic low. Because the PG clock-gating circuit 200 is previously disabled, the previous logic high state of signal CLK_GC is latched in latch 210, which causes NAND gate 121 to maintain a logic low output signal regardless of the logic state of $\overline{\text{CLK\_EN}}$. After CLK_IN transitions to logic low, it forces NOR gate 122 to drive LAT_EN to logic high, which causes pass gate 216 to turn on and pass the logic low state of CLK_EN as a logic low clock gating control signal CLK_GC. Thereafter, the logic low state of CLK_GC is fed back and logically combined with the logic high state of $\overline{\text{CLK\_EN}}$ in NAND gate 121, which drives its output signal to logic high. In response thereto, NOR gate 122 pulls down LAT_EN to logic low. As a result, $\overline{\text{LAT\_EN}}$ is driven to logic high by invertor 213. At the same time, the logic low state of CLK_GC forces NAND gate 103 to maintain its output node N2 in a logic high state, which in turn forces inverter 102 to maintain the output signal CLK_OUT in a logic low state, regardless of logic transitions in the input signal CLK_IN.

Note that the logic high state of node N2 turns off transistor MP1 and turns on transistor MN1, the logic high state of $\overline{\text{CLK\_GC}}$ turns on transistor MN3, and the logic high state of $\overline{\text{LAT\_EN}}$ turns on transistor MN2. Thus, while transistor MP1 isolates node N1 from VDD, transistors MN1-MN3 turn on and discharge node N1 low towards ground potential, thereby ensuring that CLK_GC remains in a logic low state. Further, because control circuit 120 maintains signal LAT_EN in a logic low state when clock-gating circuit 200 is enabled, power consumption associated with the toggling of internal nodes between logic states is minimized. In contrast, when the clock-gating circuit 10 of FIG. 1A is enabled, inverters INV1 and INV2 undesirably toggle their output terminals in response to logic transitions of the input signal clk_in, which not only results in undesirable power consumption but also results in continuous on/off switching of its pass gate 12.

To disable PG clock-gating circuit 200, $\overline{\text{CLK\_EN}}$ is asserted to logic low, which causes inverter 101 to drive CLK_EN to logic high. In response to the logic low state of $\overline{\text{CLK\_EN}}$, control circuit 120 logically complements CLK_IN to generate the latch enable signal LAT_EN (e.g., so that LAT_EN and CLK_IN are 180 degrees out of phase). The toggling logic state of LAT_EN causes latch 210 to periodically latch the logic high state of CLK_EN at its D input. In this manner, latch 210 maintains the clock gating control signal CLK_GC in a logic high state. In response to the logic high state of CLK_GC, NAND gate 103 passes a logically complemented value of CLK_IN to inverter 102, which in turn produces a waveform for CLK_OUT that is similar to CLK_IN (e.g., except for delays associated with inverter 102 and NAND gate 103).

When PG clock-gating circuit 200 is disabled, the clock gating control signal CLK_GC is in a logic high state, and NAND gate 103 drives node N2 to the opposite logic state of CLK_IN. The resulting logic low state of $\overline{\text{CLK\_GC}}$ turns off transistor MN3, and thus isolates node N1 from ground potential. When node N2 is in a logic low state (e.g., when CLK_IN is logic high), transistor MP1 turns on and pulls node N1 higher towards VDD, thereby "keeping" the clock gating control signal CLK_GC in a logic high state, which in turn maintains the output of NAND gate 121 at logic low.

In accordance with the present embodiments, the PG clock-gating circuit 200 may be immune to glitches resulting from enable signals $\overline{\text{CLK\_EN}}$ and CLK_EN. For example, when CLK_IN is in a logic low state while PG clock-gating circuit 200 is disabled, the control circuit 120 drives LAT_EN to logic high and therefore turns on pass gate 216. However, the logic low state of CLK_IN also forces the output of NAND gate 103 to a logic high state, thereby also preventing any glitches from affecting the output signal CLK_OUT. When CLK_IN is in a logic high state while PG clock-gating circuit 200 is disabled, control circuit 120 drives LAT_EN to logic low and therefore blocks any glitches resulting from enable signal CLK_EN.

Figure 3:
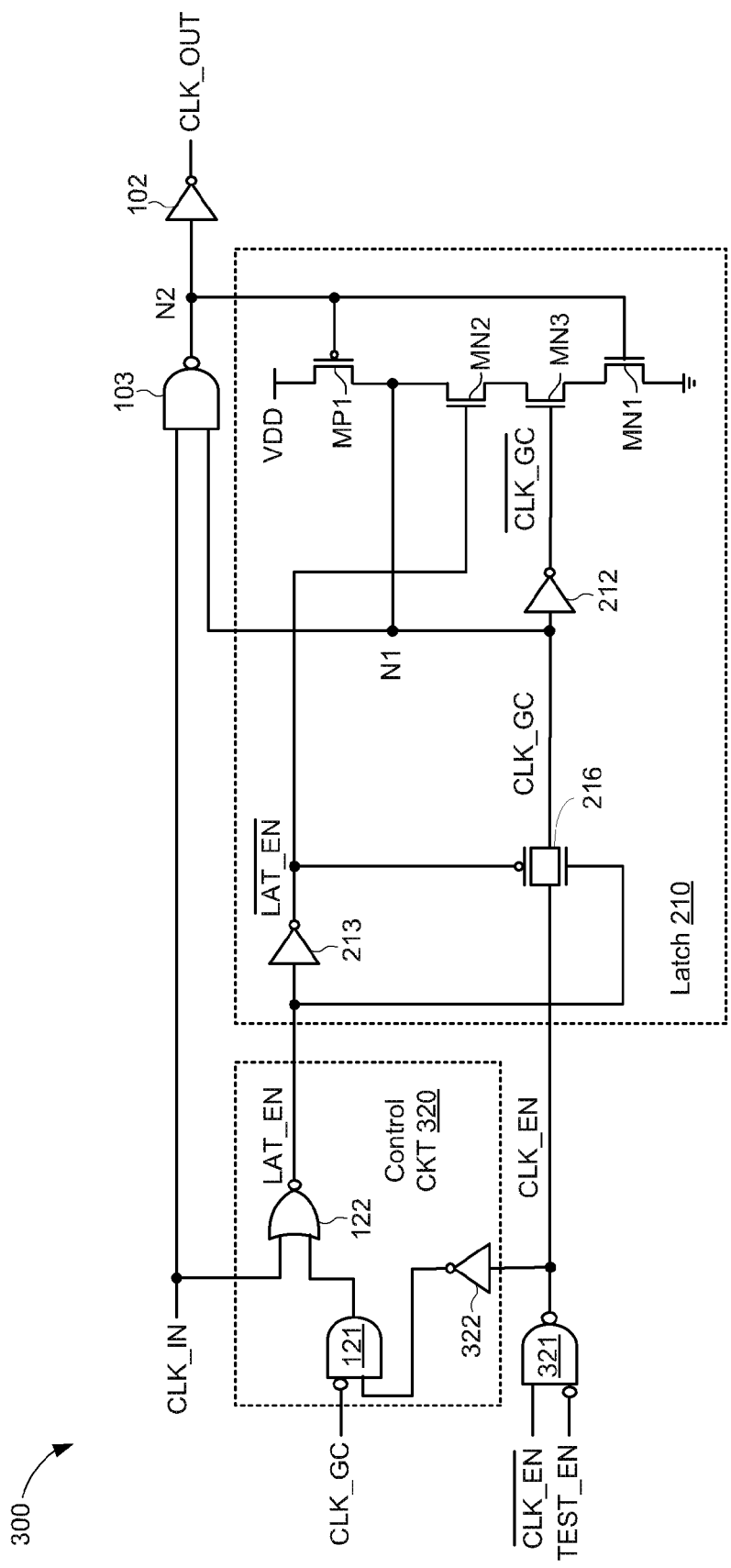
FIG. 3 is a schematic diagram of the partially gated clock-gating circuit of FIG. 1B in accordance with other embodiments.

FIG. 3 shows a PG clock-gating circuit 300 that is another embodiment of PG clock-gating circuit 100 of FIG. 1B. PG clock-gating circuit 300 is similar to PG clock-gating circuit 200 of FIG. 2, except that control circuit 120 of FIG. 2 is replaced by control circuit 320 and invertor 101 is replaced by NAND gate 321. Control circuit 320 includes AND gate 121 and NOR gate 122 of FIG. 2, plus an additional inverter 322.

NAND gate 321 includes a non-inverting input terminal to receive $\overline{\text{CLK\_EN}}$, an inverting input terminal to receive a test enable signal (TEST_EN), and an output to generate CLK_EN. Inverter 322 includes an input to receive CLK_EN and includes an output coupled to the second input terminal of AND gate 121, which in turn includes a first inverting input terminal to receive CLK_GC and an output coupled to NOR gate 122.

Figure 4:
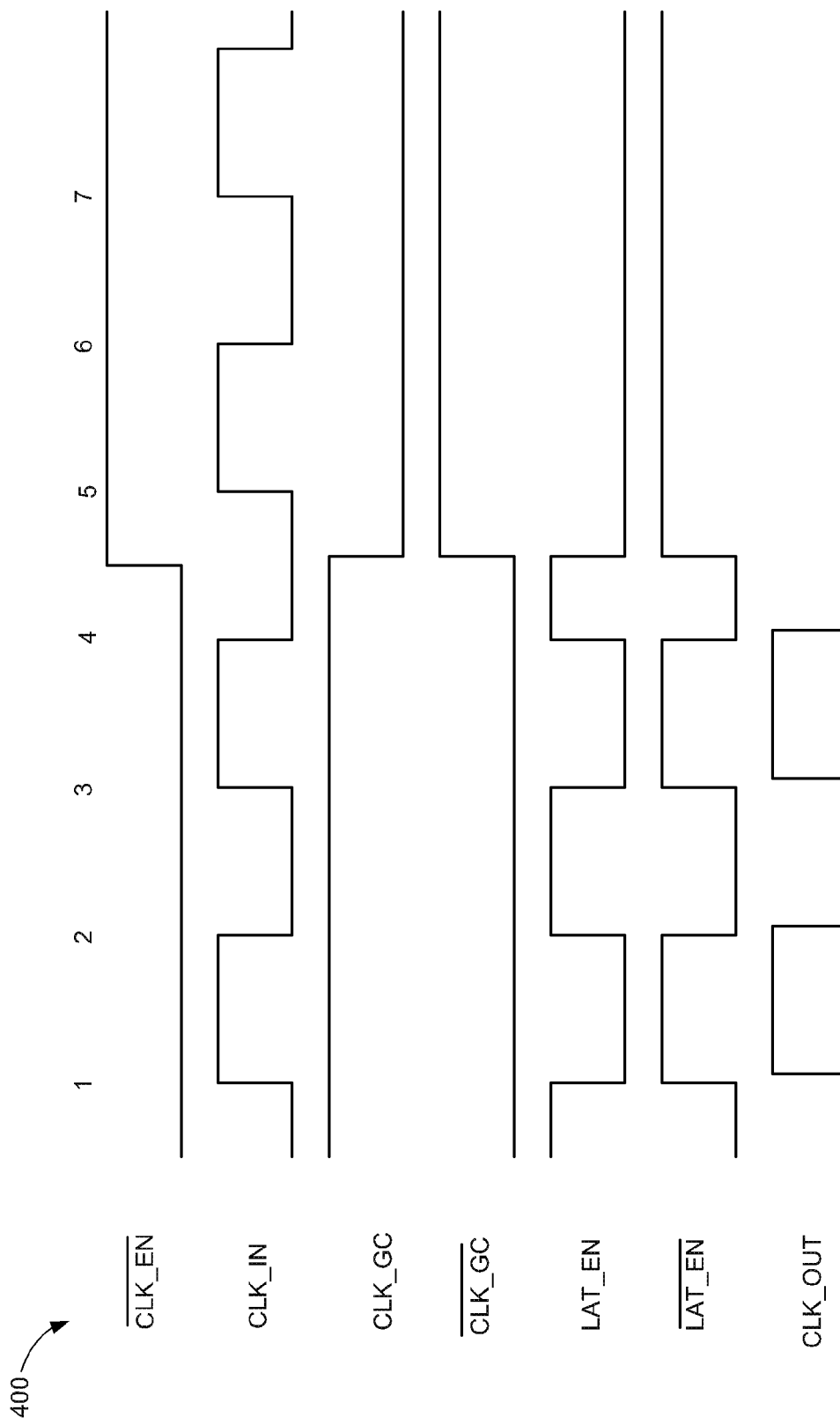
FIG. 4 is an illustrative timing diagram for signals associated with the partially gated clock-gating circuits of FIGS. 1B, 2, and 3 in accordance with some embodiments.

FIG. 4 shows an illustrative timing diagram 400 for the signals associated with the embodiments described above with respect to FIGS. 1B, 2, and 3. Referring also to FIG. 2, the clock enable signal $\overline{\text{CLK\_EN}}$ is initially de-asserted to logic low, thereby disabling PG clock-gating circuit 200 so that CLK_IN is passed as CLK_OUT. The resulting logic high state of CLK_EN is latched into latch 210 when LAT_EN transitions to logic high in response to CLK_IN transitioning to logic low, and thereafter kept in the logic high state when LAT_EN transitions to logic low in response to CLK_IN transitioning to logic high, thereby maintaining the clock gating control signal CLK_GC in a logic high state. The resulting logic high state of CLK_GC allows CLK_IN to pass through NAND gate 103 and inverter 102 to generate the waveform for CLK_OUT.

When the clock enable signal $\overline{\text{CLK\_EN}}$ is asserted to logic high, the PG clock-gating circuit 200 is enabled and prevents CLK_IN from passing through clock-gating circuit 200. More specifically, the logic high state of LAT_EN and the logic low state of $\overline{\text{LAT\_EN}}$ (previously generated by control circuit 120 and invertor 213) forces pass-gate 216 to generate a logic low state of CLK_GC, which in turn causes control circuit 120 to pull down LAT_EN and pull up $\overline{\text{LAT\_EN}}$. In response thereto, latch 210 maintains the clock gating control signal CLK_GC in a logic low state, which forces the output of NAND gate 103 to logic high and therefore forces CLK_OUT to logic low via inverter 102.

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A clock gating circuit, comprising:
    a first input terminal to receive an input clock signal;
    a second input terminal to receive a clock enable signal;
    a latch control circuit having first and second input terminals to receive the input clock signal and the clock enable signal, and having an output terminal to generate a latch enable signal;
    a storage latch having a data terminal responsive to the clock enable signal, a latch enable terminal responsive to the latch enable signal, and having an output terminal to generate a clock gating control signal; and
    a logic gate having input terminals to receive the input clock signal and the clock gating control signal, and having an output terminal to generate an output clock signal.

2. The clock gating circuit of claim 1, wherein the latch control circuit is to force the latch enable signal to a constant logic state when the clock gating circuit is enabled to gate the input clock signal.

3. The clock gating circuit of claim 1, wherein the latch control circuit is to pass the input clock signal as the latch enable signal when the clock gating circuit is disabled to allow the input clock signal to propagate as the output clock signal.

4. The clock gating circuit of claim 1, wherein the latch control circuit includes a third input terminal to receive the clock gating control signal.

5. The clock gating circuit of claim 4, wherein the latch control circuit comprises:
   an AND gate having a first input responsive to the clock enable signal, a second input responsive to the clock gating control signal, and an output; and
   a NOR gate having a first input responsive to the input clock signal, a second input coupled to the output of the AND gate, and an output to generate the latch enable signal.

6. The clock gating circuit of claim 4, wherein the latch control circuit comprises:
   an inverter having an input responsive to the clock enable signal, and an output;
   an AND gate having a first input coupled to the output of the inverter, a second input responsive to the clock gating control signal, and an output; and
   a NOR gate having a first input responsive to the input clock signal, a second input coupled to the output of the AND gate, and an output to generate the latch enable signal.

7. The clock gating circuit of claim 1, wherein the storage latch comprises:
   a PMOS transistor and first, second, and third NMOS transistors coupled in series between a supply voltage and ground potential, wherein the gates of the PMOS transistor and the first NMOS transistor are connected to the output terminal of the logic gate, the gate of the second NMOS transistor is responsive to the latch enable signal, and the gate of the third NMOS transistor is responsive to the clock gating control signal; and
   a pass gate having an input terminal responsive to the clock enable signal, an output to generate the clock gating control signal, and a control terminal responsive to the latch enable signal.

8. The clock gating circuit of claim 7, wherein the latch enable signal is to maintain the pass gate in a non-conductive state in response to de-assertion of the clock enable signal.

9. A clock gating circuit for selectively passing an input clock signal as an output clock signal in response to a clock enable signal, the clock gating circuit comprising:
   a latch control circuit having input terminals to receive the input clock signal, the clock enable signal, and a clock gating control signal, and having an output terminal to generate a latch enable signal;
   a storage latch having a data terminal responsive to the clock enable signal, a latch enable terminal responsive to the latch enable signal, and having an output terminal to generate the clock gating control signal; and
   a logic gate having input terminals to receive the input clock signal and the clock gating control signal, and having an output terminal to generate an output clock signal.

10. The clock gating circuit of claim 9, wherein the latch control circuit is to force the latch enable signal to a constant logic state when the clock gating circuit is enabled.

11. The clock gating circuit of claim 10, wherein the logic gate forces the output clock signal to a constant logic state when the clock gating circuit is enabled.

12. The clock gating circuit of claim 9, wherein the latch control circuit is to pass the input clock signal as the latch enable signal when the clock gating circuit is disabled.

13. The clock gating circuit of claim 12, wherein the logic gate passes the input clock signal as the output clock signal when the clock gating circuit is disabled.

14. The clock gating circuit of claim 9, wherein the latch control circuit comprises:
   an AND gate having a first input responsive to the clock enable signal, a second input responsive to the clock gating control signal, and an output; and
   a NOR gate having a first input responsive to the input clock signal, a second input coupled to the output of the AND gate, and an output to generate the latch enable signal.

15. The clock gating circuit of claim 9, wherein the latch control circuit comprises:
   an inverter having an input responsive to the clock enable signal, and an output;
   an AND gate having a first input coupled to the output of the inverter, a second input responsive to the clock gating control signal, and an output; and
   a NOR gate having a first input responsive to the input clock signal, a second input coupled to the output of the AND gate, and an output to generate the latch enable signal.

16. The clock gating circuit of claim 9, wherein the storage latch comprises:
   a PMOS transistor and first, second, and third NMOS transistors coupled in series between a supply voltage and ground potential, wherein the gates of the PMOS transistor and the first NMOS transistor are connected to the output terminal of the logic gate, the gate of the second NMOS transistor is responsive to the latch enable signal, and the gate of the third NMOS transistor is responsive to the clock gating control signal; and
   a pass gate having an input terminal responsive to the clock enable signal, an output to generate the clock gating control signal, and a control terminal responsive to the latch enable signal.

17. The clock gating circuit of claim 16, wherein the latch enable signal is to maintain the pass gate in a non-conductive state in response to de-assertion of the clock enable signal.

* * * * *